United States Patent
Stellari (10) Patent No.: US 9,632,136 B2
(45) Date of Patent: Apr. 25, 2017

(54) PRECISE ESTIMATION OF ARRIVAL TIME OF SWITCHING EVENTS CLOSE IN TIME AND SPACE

(71) Applicant: INTERNATIONAL BUSINESS MACHINES CORPORATION, Armonk, NY (US)

(72) Inventor: Franco Stellari, Waldwick, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 1021 days.

(21) Appl. No.: 13/856,805

(22) Filed: Apr. 4, 2013

(65) Prior Publication Data

US 2014/0303917 A1    Oct. 9, 2014

(51) Int. Cl.
| | | |
|---|---|---|
| G01R 13/00 | (2006.01) | |
| G01R 31/311 | (2006.01) | |
| G01R 13/34 | (2006.01) | |
| G01R 13/02 | (2006.01) | |

(52) U.S. Cl.
CPC .......... *G01R 31/311* (2013.01); *G01R 13/029* (2013.01); *G01R 13/345* (2013.01)

(58) Field of Classification Search
CPC .. G01R 13/029; G01R 31/311; G01R 13/345; G01R 19/2513; G01R 13/0254; G01R 27/02; G01R 23/167; G01R 23/16; G01R 25/00; G01R 29/18; G01R 29/02; G01R 31/31725; G01R 29/0273; G01R 31/2601; G01R 31/2834; G01R 31/2894; G06F 17/5036; G06K 9/00536

USPC .... 702/57, 65–67, 70–73, 79, 108, 116–125, 702/183

See application file for complete search history.

(56) References Cited

U.S. PATENT DOCUMENTS

| | | | | |
|---|---|---|---|---|
| 2,913,663 A | * | 11/1959 | Cooper | G01R 13/04 324/76.33 |
| 4,791,357 A | * | 12/1988 | Hyduke | G01R 31/31935 324/73.1 |
| 4,825,379 A | * | 4/1989 | Luthra | G01R 13/345 324/76.77 |

(Continued)

FOREIGN PATENT DOCUMENTS

| | | | | | |
|---|---|---|---|---|---|
| JP | 01068672 A | * | 3/1989 | | |
| RU | WO 0000837 A1 | * | 1/2000 | ....... | G01R 31/31725 |
| WO | WO 0133240 A2 | * | 5/2001 | ....... | G01R 31/31725 |

OTHER PUBLICATIONS

Applicant's Interview Request Form.*

(Continued)

*Primary Examiner* — Mohamed Charioui
*Assistant Examiner* — Leonard S Liang
(74) *Attorney, Agent, or Firm* — Tutunjian & Bitetto, P.C.; Vazken Alexanian (57) ABSTRACT

Methods and systems for estimating arrival time of switching events include measuring two or more emission events from a device under test under different skew conditions. The two or more emission events are close in time and space when no skew condition is applied. The measured waveforms of the two or more emission events are analyzed with associated skew conditions to determine a skew value that corresponds with a time separation between the two or more emission events.

20 Claims, 5 Drawing Sheets

```
┌─────────────────────────────────┐
│ Introduce different skew values │
│ for at least one switching event│
│              202                │
└─────────────────────────────────┘
                │
                ▼
┌─────────────────────────────────┐
│  Acquire TRE measurement for    │
│      each skew condition        │
│              204                │
└─────────────────────────────────┘
                │
                ▼
┌─────────────────────────────────┐
│   Analyze resulting waveforms   │
│    based on the skew conditions │
│              206                │
└─────────────────────────────────┘
```

(56) References Cited

U.S. PATENT DOCUMENTS

| | | | | |
|---|---|---|---|---|
| 5,122,978 | A * | 6/1992 | Merrill | G01R 25/02 702/79 |
| 5,231,598 | A * | 7/1993 | Vlahos | G01R 31/31725 324/76.82 |
| 5,499,190 | A * | 3/1996 | Takahashi | G01R 13/347 324/621 |
| 5,991,890 | A * | 11/1999 | Brown | G01R 31/31725 702/117 |
| 6,477,668 | B1 * | 11/2002 | Ito | G01R 31/31926 714/700 |
| 2003/0004664 | A1 * | 1/2003 | Ward | G01R 23/20 702/69 |
| 2003/0020448 | A1 | 1/2003 | Muljono et al. | |
| 2003/0094937 | A1 * | 5/2003 | Soma | G01R 31/31725 324/76.39 |
| 2004/0001017 | A1 * | 1/2004 | Chow | G01R 31/2834 341/155 |
| 2005/0262454 | A1 | 11/2005 | Chase et al. | |
| 2006/0164113 | A1 * | 7/2006 | Song | G01R 31/311 324/750.3 |
| 2006/0220664 | A1 * | 10/2006 | Stellari | G01R 31/31709 324/754.23 |
| 2007/0182402 | A1 * | 8/2007 | Kojima | G01R 31/31703 324/762.03 |
| 2007/0236206 | A1 | 10/2007 | Kasapi et al. | |
| 2008/0114563 | A1 * | 5/2008 | Kappauf | G01R 31/319 702/124 |
| 2008/0164414 | A1 | 7/2008 | Stellari et al. | |
| 2009/0234604 | A1 * | 9/2009 | Hou | G01R 31/31725 702/69 |
| 2011/0280468 | A1 | 11/2011 | Song et al. | |
| 2014/0201561 | A1 * | 7/2014 | Restle | G06F 1/10 713/503 |

OTHER PUBLICATIONS

*Electric Power Group* v. *Alstom*.*

Muroyama, M., et al. "A Variation-Aware Low-Power Coding Methodology for Tightly Couple Buses" Proceedings of the 2005 Conference on Asia South Pacific Design Automation, ASP-DAC 2005. Jan. 2005. pp. 557-560.

Stellari, F., et al. "Switching Time Extraction of CMOS Gates Using Time-Resolved Emission (TRE)" IEEE 06CH37728 44th Annual International Reliability Physics Symposium. Mar. 2006. pp. 566-573.

* cited by examiner

PRECISE ESTIMATION OF ARRIVAL TIME OF SWITCHING EVENTS CLOSE IN TIME AND SPACE

GOVERNMENT RIGHTS

This invention was made with Government support under Contract No.: FA8650-11-C-7105 awarded by the National Security Agency (NSA). The Government has certain rights in this invention.

BACKGROUND

Technical Field

The present invention relates to time resolved emission circuit analysis and, more particularly, to timing analysis of emission events that are close in time and space.

Description of the Related Art

Analytical tools are commonly used for characterizing, testing, and debugging VLSI circuits. Some tools and techniques, such as emission tools based on off-state leakage currents and laser based stimulation tools, focus mostly on improving manufacturing process steps such as reducing leakage and variability, or improving performance and yield. Other tools and techniques, such as Time-Resolved Emission (TRE), focus mostly on probing time dependent signals from specific nodes and transistors of a VLSI circuits in order to understand its behavior and performances. Some faulty behavior of the chip may be investigated to understand the cause of faults and possibly guide process engineers or circuit designers to fix problems in new releases of the hardware.

Tester-based approaches for identifying emission sites significantly enhance device localization resolution. One tester-based approach is based on combining electrical stimuli tuning provided by automatic test equipment with optical characterization performed by emission tools. With image post-processing techniques, one can simplify localization and identification of devices that can be affected by electrical stimuli, such as clock frequency changes; logic state changes; switching activity (using time resolved emission measurements), etc. This whole process can be made in an interactive fashion. For the device that is interested, a test pattern can be generated to separate it from its neighbor devices using light emission.

However, devices that are close to one another in space and time can be difficult to resolve. Existing techniques for resolving such devices all have drawbacks. For example, one approach is to turn off one of the devices. However, in a complex circuit this may not be possible. Furthermore, this does not take into account the possibility that the absence of one of the signals (including all the circuitry before and after the switching gate of the interest) may significantly change the switching conditions of the remaining gate, for example by changing the power noise environment.

SUMMARY

A method for estimating arrival time of switching events includes measuring two or more emission events from a device under test under a plurality of different skew conditions, wherein the two or more emission events are close in time and space when no skew condition is applied; and analyzing measured waveforms of the two or more emission events with associated skew conditions, using a processor, to determine a skew value that corresponds with a time separation between the two or more emission events.

A system for estimating arrival time of switching events includes a sensor configured to measure two or more emission events from a device under test under a plurality of different skew conditions, wherein the two or more emission events are close in time and space when no skew condition is applied; and a waveform analysis module comprising a processor configured to analyze measured waveforms of the two or more emission events with associated skew conditions to determine a skew value that corresponds with a time separation between the two or more emission events.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Embodiments of the present invention provide enhanced resolvability of signals from devices that are close in space and time. "Close in space" is used to mean that the separation between components on the device under test (DUT) is below the spatial resolution of the imaging tool, while "close in time" is used to mean that the separation in time of two events is below the temporal resolution of the tool. If two emission events occur close in space and time, the events merge into a single measured waveform.

Figure 1:
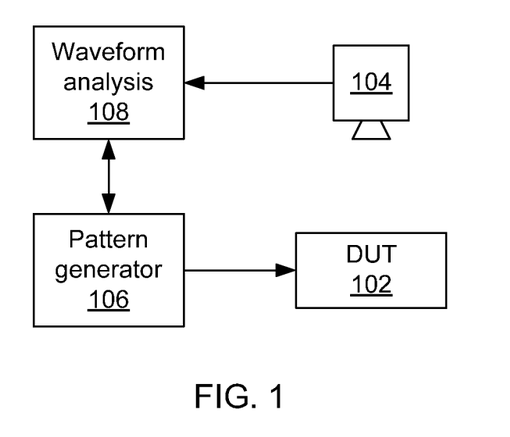
FIG. 1 is a diagram of a time resolved emission (TRE) analysis system in accordance with the present principles.

Referring now to the drawings in which like numerals represent the same or similar elements and initially to FIG. 1, a time-resolved emission (TRE) analysis system is shown. A DUT 102 is observed by a camera 104. The camera 104 records optical emissions from the DUT that indicate the state of one or more components on the DUT 102. For example, when a semiconductor device such as a field effect transistor (FET) undergoes a change in state, the FET may spontaneously emit light. Camera 104 may be any suitable sensor that is sensitive to the emissions in question. These emissions can be collected to provide a picture of the DUT 102 at a point in time that characterizes which devices are being activated. By taking such pictures over a period of time, the evolution of activations on the DUT 102 can be tracked and analyzed, providing a visual indication of chip functioning.

A pattern generator 106 provides instructions to the DUT 102. These test patterns trigger components on the DUT 102 and are intended to test specific components on the DUT 102, such that specific functions and structures may be tested. The pattern generator 106 also provides its test patterns to waveform analysis block 108, which correlates the test patterns with detected waveforms received from camera 104. In an alternative embodiment, on-chip control signals or tuning bits may be used to alter on-chip delays leading to the emission events in question. This allows the introduction of skew without a specific skew signal from a pattern generator 106. Exemplary on-chip tunable variables may include, e.g., changes in regulated supply voltages, changes in current drive or current controlled relay lines, phase changes in phase-locked loop circuits, changes in load circuits, changes in driving strength of clock buffers, and so on. A further embodiment may employ noise sources to cause jitter and therefore skew in one of the switching signals compared to the other one. This may include, e.g., power supply noise, PLLs jitter, etc.

The components on DUT 102 may be smaller than the theoretical diffraction limit of camera 104. The camera 104 may be based on, e.g., a conventional air gap microscopy lens or on a solid immersion lens. A solid immersion lens allows a significant increase of the numerical aperture of the collection optics, thus increasing both the lateral spatial resolution and the collection efficiency.

When attempting to resolve components on the DUT 102 that are close in time and space, the pattern generator 106 produces test patterns where one of the switching peaks is skewed in time by an amount larger than the time resolution of the camera 104. Waveform analysis block 108 calculates the un-skewed time position between the two emission events by performing one or more analyses, as will be discussed in greater depth below.

Figure 2:
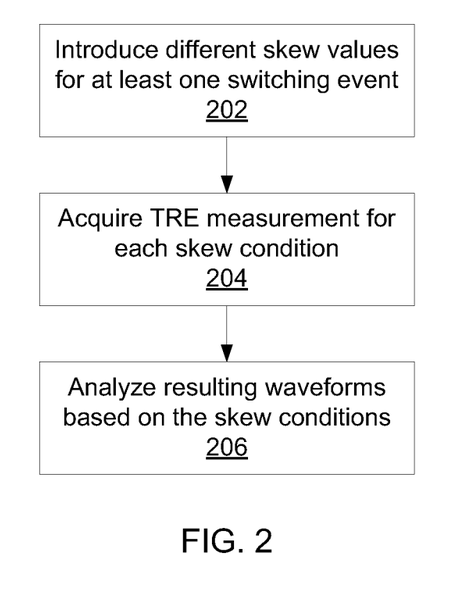
FIG. 2 is a block/flow diagram of a method for determining the temporal distance between two events that are close in time and space in accordance with the present principles.

Referring now to FIG. 2, a method for tester-based (TRE) analysis is shown. Block 202 introduces a set of skew values for at least one switching event in a set of devices that are close in space and time. Multiple different skew values may be introduced at a fine or coarse pace to aid the determination of the initial position of the detected peaks. As noted above, the skew values may be provided by a pattern generator 106 or may be set using on-chip tunables or noise sources. The skew values may have a fixed step size or may be non-uniform. Both switching events may be skewed in this manner. In this embodiment, the emission event peaks may be skewed alternatively. Skewing both peaks provides more freedom in the analysis and potentially improves delay estimates. It should be recognized that, although all embodiments discussed herein distinguish between two components on a DUT 102 that are close in time and space, the embodiments may be readily extended to any number of such neighboring components. In this case, block 202 will generate a different skew value for each component.

Block 204 acquires TRE measurements for each skew condition. Depending on the DUT 102 and the particular spatial and temporal relationships between emission events, a single skew value may be sufficient to resolve some components. By providing a set of skew measurements, however, the likelihood of resolving additional components increases. This may be the case if the first skew attempted fails to provide distinguishing information between the events. Furthermore, providing a set of measurements allows for more complex forms of analysis, as set forth below.

Block 206 analyzes the waveforms detected by camera 104. The analysis uses information about the associated skew conditions to determine the location and timing of discrete emission events from components that are close in space and time. There are a number of different types of analysis which may be used including, e.g., waveform averaging, waveform amplitude maximization, full width at half maximum (FWHM) analysis, and skew interpolation.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
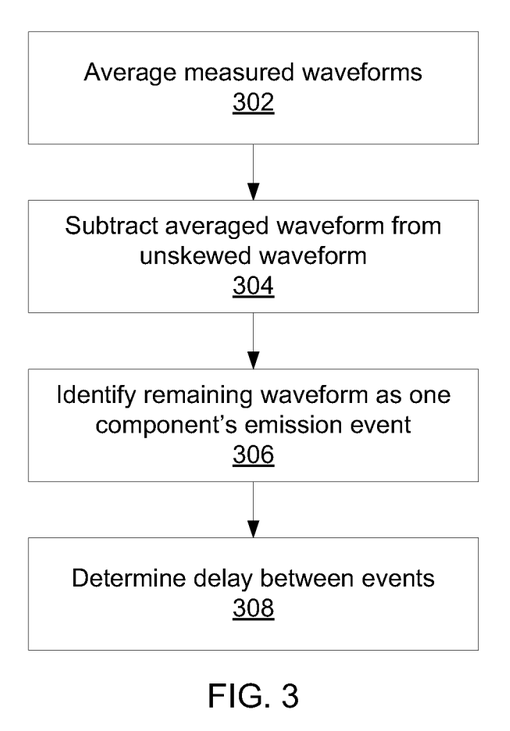
FIG. 3 is a block/flow diagram of a method of TRE waveform analysis in accordance with the present principles.

Referring now to FIG. 3, a waveform averaging method for TRE waveform analysis is shown. For the sake of discussion, it is convenient to identify two components, a first component and a second component, that are close in time and space. Block 302 averages the set of TRE waveforms collected from the components in block 204, each of which was acquired by introducing different skews/delays for the second component. The averaged waveform is used to precisely identify the position of the first component. The emissions from the first component will remain statistically unchanged among the acquired TRE waveforms because no skew is applied to that component, while the emissions from the second component will be at different time positions for each waveform. As a result, the contribution of the second component's emission events to the average will be reduced in proportion to the number of waveforms in the set.

Block 304 subtracts the averaged waveform from a waveform where neither emission event is skewed. Because the first component will have a strong signal in both waveforms, its emission events are removed. This leaves the emission contribution from the second component at block 306. Block 308 determines the delay between the two events. This delay may be determined using, e.g., peak fitting with a Gaussian, a centroid calculation, a barycentre calculation, etc. It should be noted that the signal-to-noise ratio (SNR) of the averaged waveform will be different from that of the unskewed waveform. To make the SNRs of the two switching events more comparable, so that similar precision in the switching time position may be achieved for both components, it may be helpful to increase the acquisition time of the unskewed waveform in proportion to the total acquisition time of the entire set of averaging waveforms.

Figure 4:
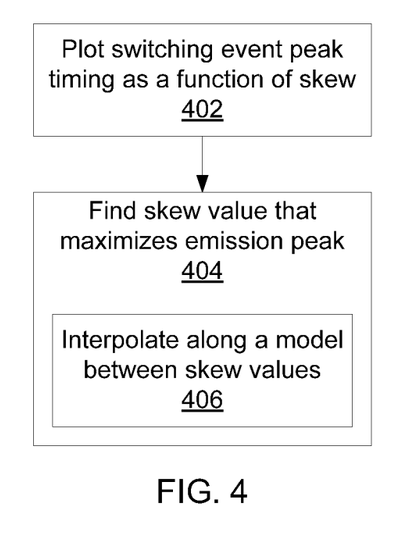
FIG. 4 is a block/flow diagram of a method of TRE waveform analysis in accordance with the present principles.

Referring now to FIG. 4, a waveform amplitude maximization method for TRE waveform analysis is shown. Block 402 plots the set of TRE measurements as a function of skew value. The emission intensity of the switching events is substantially independent from the skew introduced between the events. Therefore the measured TRE waveform for a given skew will be the sum of the two switching emission peaks shifted in time. Only when the two switching even are perfectly aligned in time there will be an optimal summation of the emission intensity, thus leading to the maximum amplitude of the measured switching emission peak in the waveform corresponding to such a skew.

Block 404 determines this maximum amplitude and determines the skew value that corresponds to it. Because the maximum may not occur exactly at one of the skew values used, a fitting model or theoretical model may be used to interpolate the available data and estimate the position of the maximum in block 406. It should be recognized that any appropriate model may be used to fit the data. This allows block 404 to find a more accurate skew value than the time resolution of the TRE emission measurements would otherwise provide.

Figure 5:
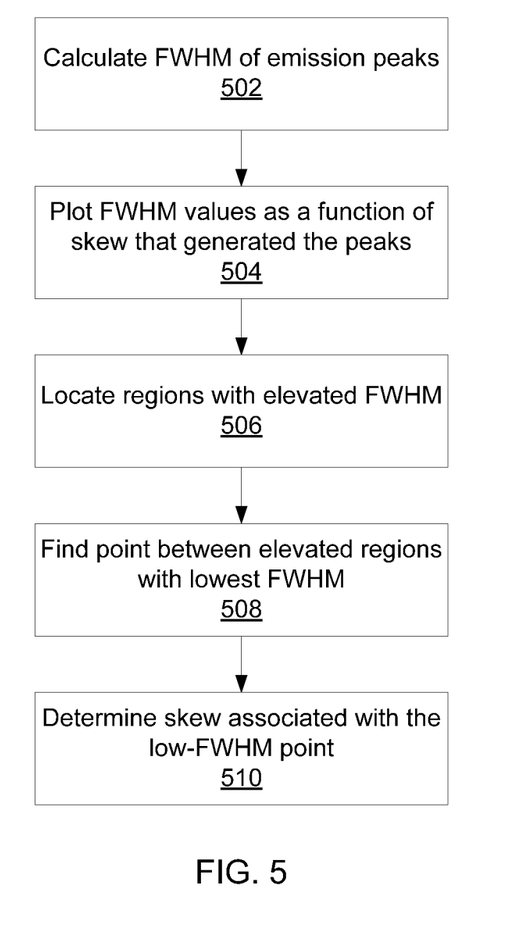
FIG. 5 is a block/flow diagram of a method of TRE waveform analysis in accordance with the present principles.

Referring now to FIG. 5, a FWHM method for TRE waveform analysis is shown. Block 502 determines the FWHM of emission peaks in each of the set of TRE emission measurements. Although FWHM is specifically contemplated for this embodiment, other measures of peak width may be used such as, e.g., the standard deviation. Again, because the two emission events are substantially independent, the FWHM corresponding to the switching emission peaks would be substantially unaffected by the introduced skew. When the two emission events are partially overlapping in time, the resulting TRE waveform will have a FWHM that will depend on the FWHM of the individual switching events as well as the skew between them, such that the measured FWHM will be larger for the combined emission than the duration of each individual emission. When the emission events have perfect alignment, then the TRE waveform will have a smaller FWHM.

Block 504 therefore plots FWHM values as a function of the skews that generated the measured peaks. Block 506 locates regions on the plot that have elevated FWHM measurements. These measurements correspond to regions of partial overlap between emission events, where the width of the measured waveform is increased. As the partial overlap increases to full overlap, the width of the measured waveform will decrease to roughly the size of a single emission event. Block 508 therefore finds the lowest point between the elevated regions. This minimal central FWHM corresponds to the unaltered skew between the emission events at block 510.

Figure 6:
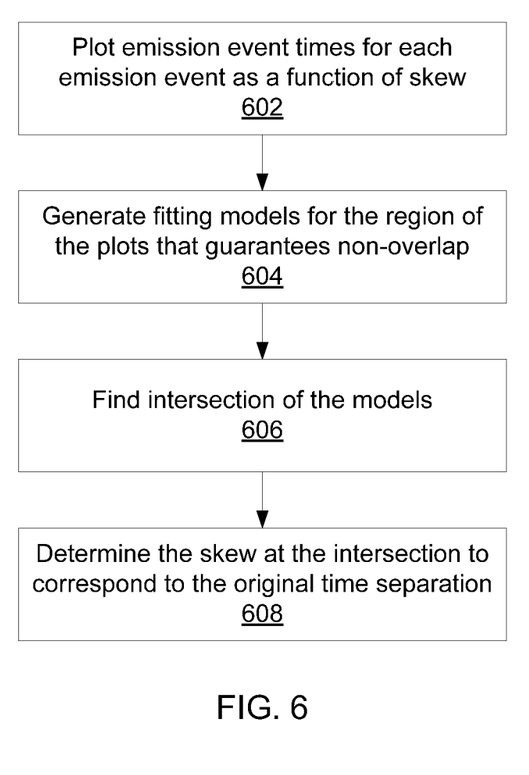
FIG. 6 is a block/flow diagram of a method of TRE waveform analysis in accordance with the present principles.

Referring now to FIG. 6, a first skew interpolation method for TRE waveform analysis is shown. Block 602 plots emission event times for each emission event separately as a function of skew. The two emission events will be easily separable for part of the graph and overlap for another part of the graph. For the parts of the graph where the emission events can be separated, block 604 generates fitting models. A linear fitting model may be used to show how the skewed emission event changes with respect to delay value. It is specifically contemplated that the fitting models will be linear, but it should be recognized that any fitting model may be used if it provides accurate interpolation for the region in question. Block 606 uses the fitting models to interpolate into the region of the graph where the emission events overlap, finding an intersection point between the models. Block 608 uses this intersection point as the value of the original time separation between the emission events.

Figure 7:
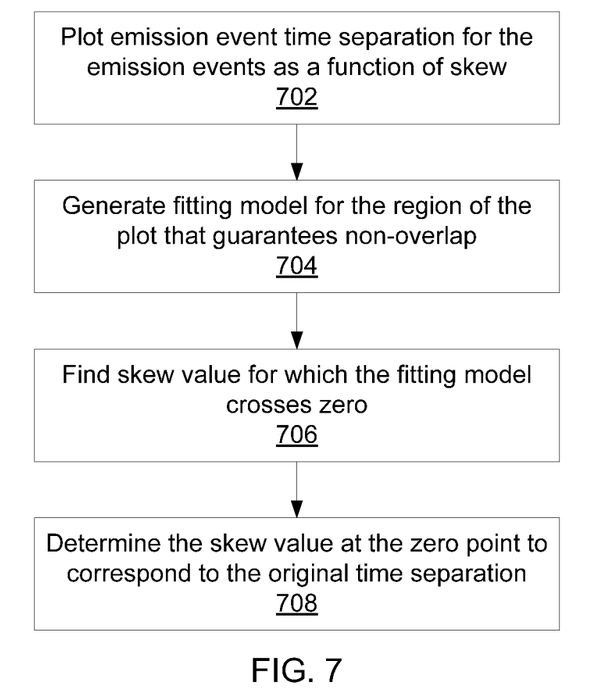
FIG. 7 is a block/flow diagram of a method of TRE waveform analysis in accordance with the present principles.

Referring now to FIG. 7, an alternative skew interpolation method for TRE waveform analysis is shown. Block 702 measures a time separation between the peaks of the emission events and plots the time separation values as a function of skew. As above, there will be regions of the plot where the two emission events can be readily distinguished, and a region where there will be overlap. Block 704 generates a fitting model for the plot based on the values in the regions with guaranteed non-overlap.

In this case, the fitting model interpolates the separation of the peaks into the region where the peaks overlap. Block 706 locates the skew value for which the fitting model crosses the point of zero separation between the peaks. In an alternative embodiment, block 706 may estimate a separation at which no skew is applied. Block 708 determines this skew value to represent the original time separation between the emission events.

While the above analysis methods are specifically contemplated, it should be recognized that alternative forms of TRE measurement analysis may be employed as well. Furthermore, multiple forms of analysis may be employed, with some form of averaging or agreement determination being made to improve the accuracy of the analysis. The analysis or analyses may be selected in accordance with considerations of the amount of possible skew as well as how the skew is introduced. For example, if the skew is introduced by causing jitter in the circuit, a FWHM analysis may be more difficult to apply compared to analysis based on averaging waveforms. In another example, if the maximum skew is not sufficient to fully separate the switching events, the skew interpolation analysis methods described above will be unable to find a suitable fitting model. In these cases, those having ordinary skill in the art will be able to select an appropriate analysis or analyses based on the particular data being collected.

Figure 8:
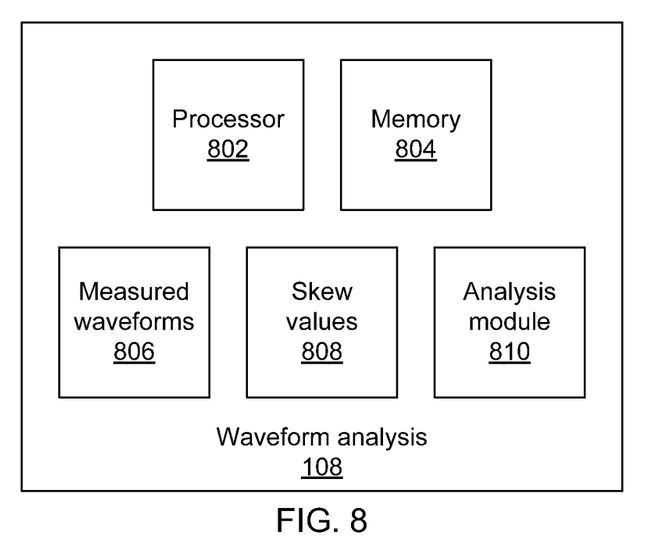
FIG. 8 is a diagram of a waveform analysis module in accordance with the present principles.

Referring now to FIG. 8, a waveform analysis system 108 is shown. The waveform analysis system 108 includes a processor 802 and memory 804. The memory 804 stores skew values 808 from pattern generator 106 and measured waveforms 806 from camera 104. An analysis module 810 uses processor 802 to perform one or more of the above-described analyses based on the measured waveforms 806 and the skew values 808 to determine a temporal distance between emission events.

Having described preferred embodiments of a system and method for the precise estimation of arrival time of switching events close in time and space (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for estimating arrival time of switching events, comprising:
    testing a device under test under a plurality of different skew conditions by applying test patterns to the device under test;
    measuring two or more emission events from the device under test under each of the plurality of different skew conditions using an imaging tool, wherein the two or more emission events are close in time and space when no skew condition is applied; and
    analyzing measured waveforms of the two or more emission events with associated skew conditions, using a processor, to determine a skew value that corresponds with a time separation between the two or more emission events.

2. The method of claim 1, wherein analyzing the measured waveforms comprises:
averaging measured waveforms;
subtracting the averaged waveform from an non-skewed waveform to generate a remainder waveform; and
calculating a difference between the averaged waveform and the remainder waveform.

3. The method of claim 2, wherein a time of at which the non-skewed waveform is acquired is proportional to an aggregate acquisition time for the averaged waveforms.

4. The method of claim 1, wherein analyzing the measured waveforms comprises:
plotting emission event peak timing as a function of skew value; and
determining a skew value that maximizes the emission event peaks.

5. The method of claim 4, wherein determining the skew value that maximizes emission event peaks comprises interpolating between measured skew values according to a fitting model.

6. The method of claim 1, wherein analyzing the measured waveforms comprises:
calculating a full width at half maximum (FWHM) for emission peaks in each measured waveform;
locating regions in a plot of FWHM values against skew value that have elevated FWHM values; and
determining a skew value that corresponds to a minimal FWHM value between the located regions.

7. The method of claim 1, wherein analyzing the measured waveforms comprises:
generating fitting models for each emission event across the plurality of different skew conditions in regions where the emission events can be separated; and
determining a skew value that corresponds to an intersection between two fitting models.

8. The method of claim 1, wherein analyzing the measured waveforms comprises:
generating a fitting model for a time separation between two emission events across the plurality of skew conditions in regions where the emission events can be separated; and
determining skew value that corresponds to an a value of zero for the fitting model.

9. The method of claim 1, wherein the skew conditions comprise one or more tunable variables on the device under test.

10. The method of claim 1, wherein the skew conditions comprise one or more noise sources.

11. A computer readable storage medium comprising a computer readable program, wherein the computer readable program when executed on a computer causes the computer to perform the steps of claim 1.

12. A system for estimating arrival time of switching events, comprising:

a pattern generator configured to apply test patterns to test a device under test under a plurality of different skew conditions;
an imaging tool configured to measure two or more emission events from a device under test under each of the plurality of different skew conditions, wherein the two or more emission events are close in time and space when no skew condition is applied; and
a waveform analysis module comprising a processor configured to analyze measured waveforms of the two or more emission events with associated skew conditions to determine a skew value that corresponds with a time separation between the two or more emission events.

13. The system of claim 12, wherein the waveform analysis module is further configured to average measured waveforms, to subtract the averaged waveform from an non-skewed waveform to generate a remainder waveform, and to calculate a difference between the averaged waveform and the remainder waveform.

14. The system of claim 13, wherein a time at which the non-skewed waveform is acquired is proportional to an aggregate acquisition time for the averaged waveforms.

15. The system of claim 12, wherein the waveform analysis module is further configured to plot emission event peak timing as a function of skew value and to determine a skew value that maximizes the emission event peaks.

16. The system of claim 15, wherein the waveform analysis module is further configured to interpolate between measured skew values according to a fitting model to determine the skew value that maximizes emission event peaks.

17. The system of claim 12, wherein the waveform analysis module is further configured to calculate a full width at half maximum (FWHM) for emission peaks in each measured waveform, to locate regions in a plot of FWHM values against skew value that have elevated FWHM values, and to determine a skew value that corresponds to a minimal FWHM value between the located regions.

18. The system of claim 12, wherein the waveform analysis module is further configured generate fitting models for each emission event across the plurality of different skew conditions in regions where the emission events can be separated and to determining a skew value that corresponds to an intersection between two fitting models.

19. The system of claim 12, wherein the waveform analysis module is further configured to generate a fitting model for a time separation between two emission events across the plurality of skew conditions in regions where the emission events can be separated and to determine skew value that corresponds to an a value of zero for the fitting model.

20. The system of claim 12, wherein the skew conditions comprise one or more noise sources.

* * * * *